(12) United States Patent
Li

(10) Patent No.: US 11,508,784 B2
(45) Date of Patent: Nov. 22, 2022

(54) DISPLAY PANEL COMPRISING LIGHT ENHANCEMENT REGION

(71) Applicant: Wuhan China Star Optoelectronics Semiconductor Display Technology Co., Ltd., Wuhan (CN)

(72) Inventor: Yuanhang Li, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 324 days.

(21) Appl. No.: 16/640,081

(22) PCT Filed: Oct. 31, 2019

(86) PCT No.: PCT/CN2019/114749
§ 371 (c)(1),
(2) Date: Feb. 19, 2020

(87) PCT Pub. No.: WO2021/042473
PCT Pub. Date: Mar. 11, 2021

(65) Prior Publication Data
US 2021/0391393 A1 Dec. 16, 2021

(30) Foreign Application Priority Data

Sep. 4, 2019 (CN) .......................... 201910830874.2

(51) Int. Cl.
*H01L 27/32* (2006.01)
*H01L 51/52* (2006.01)

(52) U.S. Cl.
CPC ........ *H01L 27/3211* (2013.01); *H01L 27/323* (2013.01); *H01L 51/524* (2013.01); *H01L 2227/323* (2013.01)

(58) Field of Classification Search
CPC . H01L 27/3211; H01L 27/323; H01L 51/524; H01L 2227/323
USPC ........................................................... 257/40
See application file for complete search history.

(56) References Cited

U.S. PATENT DOCUMENTS

| 2004/0104391 | A1* | 6/2004 | Maeda | C09K 11/025 257/79 |
| 2012/0305952 | A1 | 12/2012 | Takei | |
| 2012/0319564 | A1 | 12/2012 | Ghosh et al. | |
| 2013/0175558 | A1* | 7/2013 | Orsley | C03C 3/247 257/98 |
| 2014/0151729 | A1* | 6/2014 | Orsley | H01L 33/505 257/98 |

(Continued)

FOREIGN PATENT DOCUMENTS

| CN | 102655161 | 9/2012 |
| CN | 103268884 | 8/2013 |

(Continued)

*Primary Examiner* — Duy T Nguyen

(57) ABSTRACT

The present application provides a display panel including a light emitting layer and a touch layer; wherein the light emitting layer comprises a plurality of blue light emitting units, a plurality of green light emitting units, and a plurality of red light emitting units; wherein a top of the touch layer is provided with a transparent cover plate, the transparent cover plate is provided with a light enhancement region, and a projection of the light enhancement region on the light emitting layer covers the blue light emitting units.

11 Claims, 2 Drawing Sheets

(56) References Cited

U.S. PATENT DOCUMENTS

| | | | |
|---|---|---|---|
| 2014/0159004 A1 | 6/2014 | Xiong et al. | |
| 2015/0103338 A1* | 4/2015 | Kim | H01L 51/5265 356/237.1 |
| 2016/0336385 A1 | 11/2016 | Li et al. | |
| 2017/0194391 A1 | 7/2017 | Xiong et al. | |
| 2018/0196183 A1* | 7/2018 | Son | G02B 6/0068 |
| 2019/0140154 A1* | 5/2019 | Ohmae | H01L 25/0753 |
| 2019/0285943 A1* | 9/2019 | Liu | H05K 1/181 |
| 2019/0390839 A1* | 12/2019 | Sugiyama | G02F 1/133512 |

FOREIGN PATENT DOCUMENTS

| | | |
|---|---|---|
| CN | 103680407 | 3/2014 |
| CN | 106449703 | 2/2017 |
| CN | 106449715 | 2/2017 |
| CN | 107359256 | 11/2017 |
| CN | 108400248 | 8/2018 |
| CN | 109616581 | 4/2019 |
| CN | 110048006 | 7/2019 |

\* cited by examiner

DISPLAY PANEL COMPRISING LIGHT ENHANCEMENT REGION

RELATED APPLICATIONS

This application is a National Phase of PCT Patent Application No. PCT/CN2019/114749 having International filing date of Oct. 31, 2019, which claims the benefit of priority of Chinese Patent Application No. 201910830874.2 filed on Sep. 4, 2019. The contents of the above applications are all incorporated by reference as if fully set forth herein in their entirety.

FIELD AND BACKGROUND OF THE INVENTION

The present invention relates to the field of electronic display, and in particular, to a display panel.

Organic light emitting diode (OLED) display panel includes red light emitting diodes, green light emitting diodes, and blue light emitting diodes.

Brightness of an emitted light of the OLED decreases as the illumination time increases. Compared to red and green light, blue light has a shorter wavelength and higher energy. Correspondingly, blue OLEDs have higher luminous intensity, relatively faster aging, and shorter lifespan. For example, when a blue OLED emits light for more than 20,000 hours at a brightness of 1000 cd, the brightness is reduced by 50%. Meanwhile, brightnesses of red and green light drop by 50% after emitting light for more than 100,000 hours at a brightness of 1000 cd. Therefore, the lifespan of the blue OLED greatly limits the service life of OLED display panels.

Therefore, there is an urgent need to increase the lifespan of blue OLEDs in order to increase the service life of OLED display panels.

SUMMARY OF THE INVENTION

The present application provides a display panel to improve the luminescence lifetime of blue light emitting units.

Specifically, the present application provides a display panel comprising a light emitting layer and a touch layer;

wherein the light emitting layer comprises a plurality of blue light emitting units, a plurality of green light emitting units, and a plurality of red light emitting units;

wherein a top of the touch layer is provided with a transparent cover plate, the transparent cover plate is provided with a light enhancement region, and a projection of the light enhancement region on the light emitting layer covers the blue light emitting unit.

According to one aspect of the application, wherein a projection of the light enhancement region on the light emitting layer separates from the red light emitting unit and the green light emitting unit.

According to one aspect of the application, wherein the display panel further comprises an encapsulation structure covering the light emitting layer, the touch layer is disposed on the encapsulation structure, and the encapsulation structure is a thin film encapsulation structure.

According to one aspect of the application, wherein a shape of the light enhancement region is same as a shape of the blue light emitting unit, a geometric center of the light enhancement region overlaps a geometric center of the blue light emitting unit.

According to one aspect of the application, wherein the light enhancement region is a protrusions array disposed on the transparent cover plate, the protrusions array comprises a plurality of cones having a same shape and size.

According to one aspect of the application, wherein a maximum distance between any two adjacent cones is equal to an integral multiple of a blue light wavelength, and a minimum distance between any two adjacent cones is zero.

According to one aspect of the application, wherein a height of the cones is equal to or less than 10 times of a blue light wavelength, a ratio of the height of the cones to a radius of a bottom surface is an integer.

According to one aspect of the application, wherein the light enhancement region further comprises a concave portion having a depth smaller than a thickness of the transparent cover plate, and the protrusions array is disposed in the concave portion.

According to one aspect of the application, wherein a height of the protrusions array is equal to a depth of the concave.

According to one aspect of the application, wherein the blue light emitting unit further comprises a light adjusting portion configured to adjust a real time luminous intensity of the blue light emitting unit to make an intensity of a light emitted by the blue light emitting unit in real time being positively correlated with a light emitting time of the blue light emitting unit.

According to one aspect of the application, wherein an initial luminous intensity of the blue light emitting unit is greater than or equal to 50% of a maximum luminous intensity of the blue light emitting unit, and less than or equal to 60% of the maximum luminous intensity of the blue light emitting unit.

According to one aspect of the application, wherein when a luminescent material in the blue light emitting unit is attenuated to half of the luminescent material in an initial state, a luminous intensity of the luminescent material is equal to the maximum illuminating intensity of the blue light emitting unit.

Beneficial Effects

The present application provides a light enhancement region corresponding to the blue light emitting unit in the light emitting layer on the transparent cover of the touch layer. The light enhancement region can enhance the intensity of light passing through the region, thereby extending the lifespan of the blue light emitting unit and enhancing the usage time of the display panel. In addition, since the light enhancement region can increase the light intensity passing through the region, the initial brightness of the blue light emitting unit in the present application can be set to half of the maximum brightness to achieve the brightness required when the display panel is normal. The substantial reduction of the brightness causes the attenuation speed of the luminescent material in the blue light emitting unit to be greatly reduced, further improving the service life of the blue light emitting unit.

DESCRIPTION OF SPECIFIC EMBODIMENTS OF THE INVENTION

Figure 1:
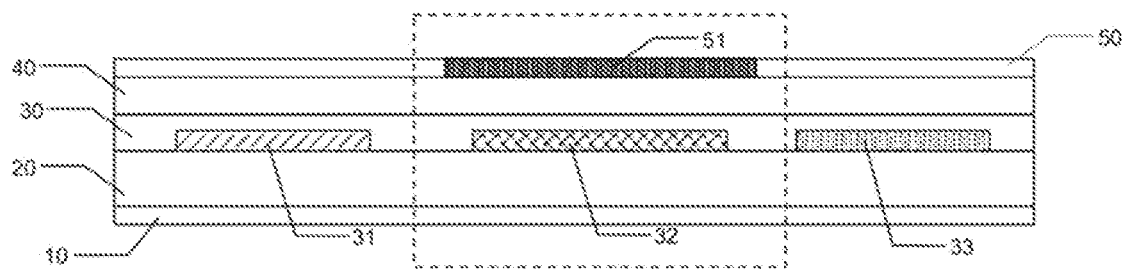
FIG. 1 is a structural diagram of a display panel in a specific embodiment of the present application.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

The present application provides a display panel to improve the luminescence lifetime of a blue light emitting unit.

Referring to FIG. 1, FIG. 1 is a structural diagram of a display panel in an embodiment of the present application. The present application provides a display panel including a substrate 10, a thin film transistor layer 20, a light emitting layer 30, and a touch layer 40. The display panel could be an organic light emitting diode display panel or a quantum dot light emitting diode display panel. The structure of the light emitting layers of different types of display panels is different. However, regardless of the type of light emitting structure, there exists technical problems that the blue light emitting unit has a faster aging speed and a shorter lifespan. The present application improves the structure of the touch layer of the display panel. Regardless of the type of display panel, the technical solution of the present application can be applied to improve the service life of the display panel. The type of display panel is not to be construed as limiting the application.

In the present application, an organic light emitting diode display panel is illustrated as an example, wherein the light emitting layer 30 includes a plurality of blue light emitting units 32, a plurality of green light emitting units 31, and a plurality of red light emitting units 33. Adjacent light emitting units are isolated by a pixel defining layer.

Figure 2:
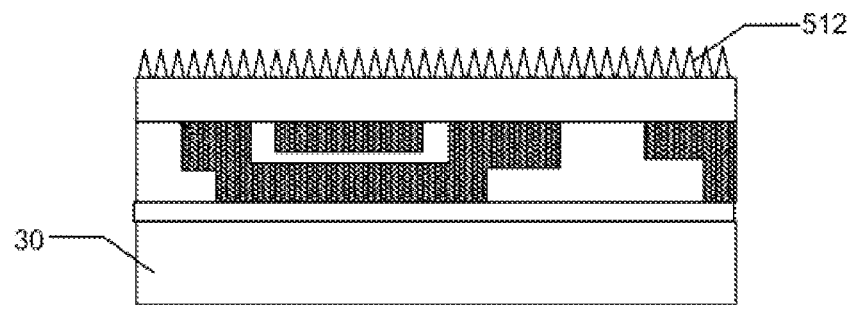
FIG. 2 is a partial enlarged view of the display panel of FIG. 1.

Referring to FIG. 1 and FIG. 2, FIG. 2 is a partial enlarged view of the display panel of FIG. 1. A top of the touch layer 40 is provided with a transparent cover 50, the transparent cover 50 is provided with a light enhancement region 51, a projection of the light enhancement region 51 on the light emitting layer 30 covers the blue light emitting units 32, and the projection of the light enhancement region 51 on the light emitting layer 30 does not overlap with the red light emitting units 33 and the green light emitting units 31.

This design is to extend the lifespan of the blue light emitting units 32 as much as possible. The lifespan of the blue light emitting units 32 is made as close as possible to the service life of the red light emitting units 33 and the green light emitting units 31. If the light enhancement region 51 is also disposed above the red light emitting units 33 and the green light emitting units 31, although the service life of the red light emitting units 33 and the green light emitting units 31 can be extended, the lifespan of the display panel as a whole is not enhanced because the service life of the blue light emitting units 32 is still the shortest. At the same time, the large-area setting of the light enhancement region 51 will lead to an increase in manufacturing costs. Therefore, in the present embodiment, the light enhancement region 51 is disposed only above the blue light emitting units 32.

In this embodiment, a shape of the light enhancement region 51 is same as a shape of the blue light emitting units 32, and a geometric center of the light enhancement region 51 overlaps with a geometric center of the blue light emitting units 32. Meanwhile, in order to secure the light enhancement effect, an area of the light enhancement region 51 is larger than an area of the blue light emitting units 32.

In this embodiment, the display panel further includes an encapsulation structure covering the light emitting layer 30, the touch layer 40 is disposed on the encapsulation structure, and the encapsulation structure is a thin film encapsulation structure.

In this embodiment, the light enhancement region 51 is a protrusions array 512 disposed on the transparent cover plate 50, and the protrusions array 512 includes a plurality of cones having a same shape and size. A maximum distance between any two adjacent cones is equal to an integral multiple of a blue light wavelength, and a minimum distance between any two adjacent cones is zero. A height of the cones is equal to or less than 10 times of a blue light wavelength, and a ratio of the height of the cones to a radius of a bottom surface of the conical protrusions is an integer.

The protrusions array 512 enables multiple reflections of the emitted light between the plurality of cones as compared to direct ejection from the transparent cover 50. Because the height of the cones and the distance between the cones are positively correlated with the wavelength of the blue light, the reflected light can be superimposed on each other. Light intensity of a final emitted light is greater than the intensity of the light incident on the transparent cover 50 to achieve light enhancement.

Figure 3:
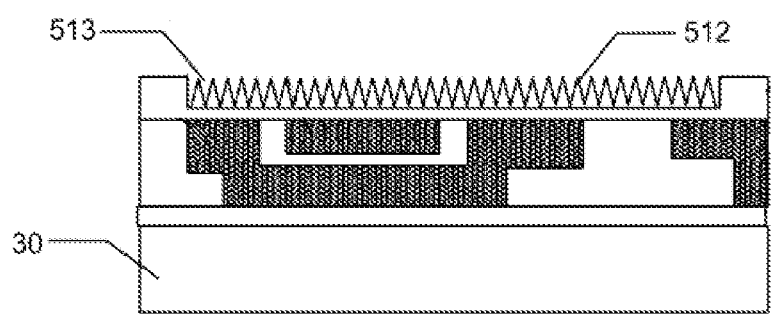
FIG. 3 is a partial enlarged view of a display panel in another embodiment of the present application.

In addition, because the transparent cover plate absorbs part of the light, and the protrusions array 512 also increases the thickness of the transparent cover, the second embodiment of the present application is therefore optimized for the transparent cover 50 and the protrusions array 512. Referring to FIG. 3, in another embodiment of the present invention, the light enhancement region 51 further comprises a concave portion 513 having a depth less than a thickness of the transparent cover plate 50, and the protrusions array is disposed in the concave portion, and a height of the protrusions array 512 is equal to the depth of the concave 513.

The structure in this embodiment can reduce the thickness of the transparent cover 50, reduce the absorption of light by the transparent cover 50, and reduce the light loss. At the same time, the protrusions array 512 is disposed in the concave 513 to keep the thickness of the transparent cover 50 uniform, reducing the thickness of the cover plate.

In this embodiment, the blue light emitting units 32 further include a light adjusting portion configured to adjust a real time luminous intensity of the blue light emitting units 32 to make an intensity of a light emitted by the blue light emitting units 32 in real time be positively correlated with a light emitting time of the blue light emitting units 32.

A light enhancement region 51 is disposed in the display panel of the present application, which can enhance the illumination intensity of the blue light, therefore, blue light emitting units can achieve the same brightness as the red light emitting units and the green light emitting units without reaching the maximum light intensity. The decrease in luminous intensity can significantly slow down the aging speed of the blue luminescent material, and further enhance the luminescence lifetime of the blue light emitting units.

Figure 4:
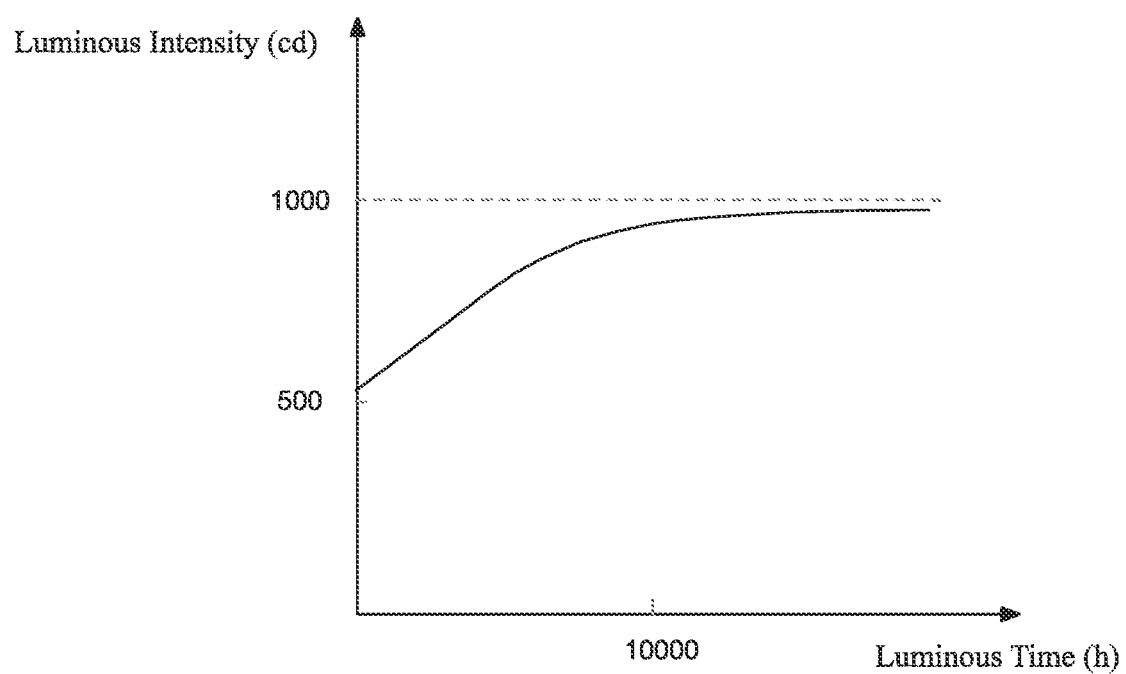
FIG. 4 is a graph showing a relationship between an initial luminous intensity and a luminous time of blue light emitting units in the display panel of FIG. 1.

Referring to FIG. 4, FIG. 4 is a diagram showing a relationship between an initial luminous intensity and a luminous time of blue light emitting units in the display panel of FIG. 1. In this embodiment, an initial luminous intensity of the blue light emitting units 32 is greater than or equal to 50% of a maximum luminous intensity of the blue light emitting units 32, and less than or equal to 60% of the maximum luminous intensity of the blue light emitting units 32. When a luminescent material in the blue light emitting units 32 is attenuated to half of the luminescent material in an initial state, the illuminating intensity of the luminescent material is equal to the maximum illuminating intensity of the blue light emitting units 32.

The present application provides the light enhancement region corresponding to the blue light emitting unit in the light emitting layer on the transparent cover of the touch layer. The light enhancement region can enhance the intensity of light passing through the region, thereby extending the lifespan of the blue light emitting unit and enhancing the usage time of the display panel. In addition, since the light enhancement region can increase the light intensity passing through the region, the initial brightness of the blue light emitting unit in the present application can be set to half of the maximum brightness to achieve the brightness required when the display panel is normal. The substantial reduction of the brightness causes the attenuation speed of the luminescent material in the blue light emitting unit to be greatly reduced, further improving the service life of the blue light emitting unit.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A display panel comprising a light emitting layer and a touch layer;
   wherein the light emitting layer comprises a plurality of blue light emitting units, a plurality of green light emitting units, and a plurality of red light emitting units; and
   wherein a top of the touch layer is provided with a transparent cover plate, the transparent cover plate is provided with a light enhancement region; and a projection of the light enhancement region on the light emitting layer only covers the blue light emitting units to enhance illumination intensity of blue light of the blue light emitting units;
   wherein the light enhancement region is an array of protrusions disposed on the transparent cover plate, and the array of protrusions comprises a plurality of cones disposed independently of each other; a maximum distance between any two adjacent cones is equal to an integral multiple of a blue light wavelength, and a minimum distance between any two adjacent cones is zero; and a height of the cones is equal to or less than 10 times of a blue light wavelength.

2. The display panel according to claim 1, wherein the projection of the light enhancement region on the light emitting layer does not overlap with the red light emitting units and the green light emitting units.

3. The display panel according to claim 1, wherein the display panel further comprises an encapsulation structure covering the light emitting layer, the touch layer is disposed on the encapsulation structure, and the encapsulation structure is a thin film encapsulation structure.

4. The display panel according to claim 1, wherein a shape of the light enhancement region is same as a shape of the blue light emitting units, and a geometric center of the light enhancement region overlaps a geometric center of the blue light emitting units.

5. The display panel according to claim 4, wherein the plurality of cones having a same shape and size.

6. The display panel according to claim 1, wherein a ratio of the height of the cones to a radius of a bottom surface of the cones is an integer.

7. The display panel according to claim 1, wherein the light enhancement region further comprises a concave portion having a depth less than a thickness of the transparent cover plate, and the protrusions array is disposed in the concave portion.

8. The display panel according to claim 7, wherein a height of the protrusions array is equal to the depth of the concave portion.

9. The display panel according to claim 1, wherein the blue light emitting units further comprise a light adjusting portion configured to adjust a real time luminous intensity of the blue light emitting units to make an intensity of a light emitted by the blue light emitting units in real time be positively correlated with a light emitting time of the blue light emitting units.

10. The display panel according to claim 9, wherein an initial luminous intensity of the blue light emitting units is greater than or equal to 50% of a maximum luminous intensity of the blue light emitting units, and less than or equal to 60% of the maximum luminous intensity of the blue light emitting units.

11. The display panel according to claim 10, wherein when a luminescent material in the blue light emitting units is attenuated to half of the luminescent material in an initial state, a luminous intensity of the luminescent material is equal to the maximum luminous intensity of the blue light emitting units.

* * * * *